United States Patent
Lu et al.

(10) Patent No.: US 8,524,049 B2
(45) Date of Patent: Sep. 3, 2013

(54) METHOD FOR FORMING METALLIC NITRIDE FILM

(76) Inventors: Fu-Hsing Lu, Taichung (TW);
Jiun-Huei Yang, Taichung (TW);
Po-Lun Wu, Taichung (TW);
Mu-Hsuan Chan, Taichung (TW)

( * ) Notice: Subject to any disclaimer, the term of this patent is extended or adjusted under 35 U.S.C. 154(b) by 965 days.

(21) Appl. No.: 12/167,361

(22) Filed: Jul. 3, 2008

(65) Prior Publication Data

US 2009/0008241 A1 Jan. 8, 2009

(30) Foreign Application Priority Data

Jul. 3, 2007 (TW) .............................. 96124204 A

(51) Int. Cl.
*C23C 14/34* (2006.01)

(52) U.S. Cl.
USPC .............. 204/192.12; 204/298.2; 204/192.16; 204/192.17

(58) Field of Classification Search
USPC ................ 204/298.2, 192.12, 192.16, 192.17
See application file for complete search history.

(56) References Cited

U.S. PATENT DOCUMENTS

| | | | |
|---|---|---|---|
| 3,726,776 A * | 4/1973 | Cuomo | .................... 204/192.24 |
| 4,098,956 A * | 7/1978 | Blickensderfer et al. | ..... 428/627 |
| 6,103,320 A * | 8/2000 | Matsumoto et al. | .......... 427/535 |
| 2004/0094402 A1* | 5/2004 | Gopalraja et al. | ....... 204/192.12 |
| 2007/0012558 A1* | 1/2007 | White et al. | ............... 204/192.1 |

FOREIGN PATENT DOCUMENTS

JP 61176159 A * 8/1986

\* cited by examiner

*Primary Examiner* — Keith Hendricks
*Assistant Examiner* — Jason M Berman
(74) *Attorney, Agent, or Firm* — Browdy and Neimark, PLLC

(57) ABSTRACT

A method for forming a metallic nitride film includes the steps of a) providing a target made of titanium or zirconium and a substrate in a vacuum chamber, and b) forming a metallic film, which is a TiN film or a ZrN film, on a surface of the substrate by sputtering deposition under the conditions of maintaining a working pressure of the vacuum chamber in a range of $5\times10^{-4}$ Torr to $5\times10^{-2}$ Torr; introducing a gas mixture of air and argon into the vacuum chamber at a flow rate ratio of the air to the argon ranging from 5:100 to 15:100, and applying a direct current power ranging from 100 Watts to 5000 Watts by a power supply. Because air can be conveniently collected and the requirement of the base pressure is lower than that of a prior art method, the method of the present invention has the advantages of simple equipment requirement, time-effective manufacturing processes and low cost.

12 Claims, 3 Drawing Sheets

METHOD FOR FORMING METALLIC NITRIDE FILM

BACKGROUND OF THE INVENTION

1. Field of the Invention

The present invention relates generally to vacuum film-forming technology and more particularly, to a method for forming metallic nitride films, such as titanium nitride (TiN) film and zirconium nitride (ZrN) film, which has the advantage of low manufacturing cost since the manufacturing processes of the method are simple and time-effective.

2. Description of the Related Art

Titanium nitride (hereinafter referred to "TiN"), which is a material commonly used for hard coatings, has the characteristics of excellent hardness ranging from 18 to 21 GPa, stable physical and chemical properties, low resistivity ranging from 18 to 170 $\mu\Omega$-cm, and good abrasion resistance and corrosion resistance, so that it is extensively used in industry. For instance, TiN is commonly used as a hard coating on a surface of a cutter to minimize the cutter's abrasion so as to extend the cutter's lifetime. In the field of electronic industry, TiN is often used as a diffusion barrier layer. Further, because exhibiting golden color, TiN is often used as a decorative layer coated on the surfaces of clocks, adornments and the like in civil industry, In addition, zirconium nitride (hereinafter refereed to as "ZrN") film is also extensively used as decorative coatings because of its color diversity and good corrosion and abrasion resistances. Further, the cutters, working tools and surfaces of dies coated with the ZrN film exhibits the advantaged of improved mechanical properties, decrease of surface abrasion and prolongation of lifetime.

TiN and ZrN films are conventionally formed by physical vapor deposition (PVD). The conventional physical vapor deposition is performed in a high vacuum circumstance, in which argon is served as sputtering gas, nitrogen is used as a reactive gas, and the plasma generated by an electrical field of a direct current power or a radio frequency power bombards a titanium target or a zirconium target such that the titanium or zirconium atoms in the solid target are ejected into the gas phase and reacted and combined with the nitrogen, resulting in that a thin TiN or ZrN film is deposited on a substrate.

Before the gas mixture of argon and nitrogen is introduced into the vacuum chamber, the vacuum chamber has to be pumped down to a base pressure of about $1 \times 10^{-6}$ Torr. This requires dedicated vacuum chamber and vacuum pump, and takes a long time, which is about 2 to 3 hours, to proceed with the evacuation; besides, the nitrogen used in the PVD method should be obtained from the purification of air. As a result, the cost of equipment and raw material used for the conventional PVD method is expensive and the manufacturing processes are complicated.

SUMMARY OF THE INVENTION

The present invention has been accomplished in view of the above-noted circumstances. It is therefore one objective of the present invention to provide a method for forming a metallic nitride film, which requires simple equipment and a low-cost raw material to perform its processes.

It is another objective of the present invention to provide a method for forming a metallic nitride film, whose manufacturing processes are simple and time-effective.

In order to achieve the aforesaid objectives, the method for forming a metallic nitride film of the present invention includes the steps of (a) providing a titanium or zirconium target and a substrate in a vacuum chamber, and (b) forming a metallic nitride film, which is a TiN film or a ZrN film, on a surface of the substrate by sputtering deposition under the conditions of maintaining a working pressure of the vacuum chamber in a range of $5 \times 10^{-4}$ Torr to $5 \times 10^{-2}$ Torr, and introducing a gas mixture of air and argon into the vacuum chamber at a flow rate ratio of the air to the argon in a range of 5:100 to 15:100. Because air used in the method of the present invention can be conveniently collected and the requirement of the base pressure is lower than that of the prior art method, the method of the present invention can be performed by using a simple equipment and has thus the advantages of time-effective manufacturing processes and low cost.

Preferably, the working pressure of the vacuum chamber is in a range of $8 \times 10^{-4}$ Torr to $2 \times 10^{-2}$ Torr in step (b), and more preferably equal to $1 \times 10^{-3}$.

Preferably, the flow rate ratio of air to argon is in a range of 7:100 to 14:100 in step b).

In a preferred embodiment of the present invention to be detailedly described hereinafter, an electrical field applied by a direct current power supply with a power in a range of 100 Watts to 5000 Watts, and preferably equal to 200 Watts, is provided in step (b). As will be however appreciated, the electrical field can be applied by an alternating current power supply.

Preferably, a biased voltage ranging from −1 to −200 V is applied to the substrate in step (b). More preferably, the biased voltage is in a range of −20 V to −50 V. As will be however appreciated, the substrate can be applied without any biased voltage.

Preferably, the step (b) is carried out at a temperature ranging from 20° C. to 300° C., and more preferably at a room temperature.

Preferably, the step (b) is performed at least 60 seconds.

Preferably, the vacuum chamber has a base pressure ranging from $5 \times 10^{-6}$ Torr to $5 \times 10^{-2}$ Torr in step (b).

Further scope of applicability of the present invention will become apparent from the detailed description given hereinafter. However, it should be understood that the detailed description and specific examples, while indicating preferred embodiments of the present invention, are given by way of illustration only, since various changes and modification within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
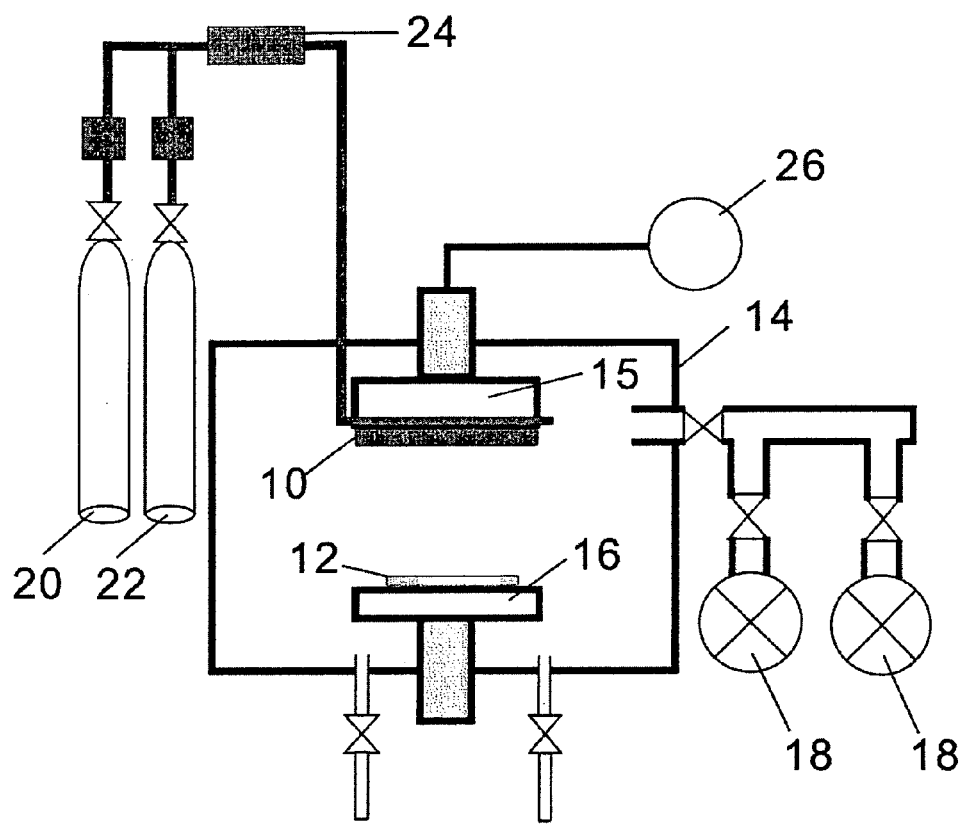
FIG. 1 is a schematic drawing showing an apparatus for performing the method of the present invention.

FIG. 1 is a schematic drawing illustrating an apparatus for performing the method for forming a metallic nitride film, such as a TiN film, according to a preferred embodiment of the present invention, in which a target 10 and a substrate 12 are placed in a vacuum chamber 14. The target 10 is made of, but not limited to, titanium and is electrically connected to a cathode 15, and the substrate 12 is a silicon chip and is electrically connected to an anode 16. Two vacuum pumps 18 are used to discharge the air inside the vacuum chamber 14 out of the vacuum chamber 14 so as to pump down the base pressure of the vacuum chamber 14 to a level about $5\times10^{-6}$ Torr at a room temperature. Thereafter, a gas mixture, which is formed by air 20 and argon 22 respectively passing through an air mixer 24 at a flow rate ratio of the air 20 to the argon 22 equal to 8:100, is introduced into the vacuum chamber 14, and at the time the working pressure of the vacuum chamber 14 is maintained at $1\times10^{-3}$ Torr. Additionally, a direct current with an output power of 200 Watts is applied to the cathode 15 and the anode 16 by a power supply 26 to generate argon plasma between the cathode 15 and anode 16 for bombarding the titanium target 10 located at the cathode 15, such that the titanium atoms in the titanium target 10 can be ejected into the vacuum chamber 14 due to the bombardment and reacted with nitride to form TiN compound, which is then deposited on a surface of the substrate 12 to form a thin film 28. The aforesaid process is so-called sputtering deposition.

Figure 2:
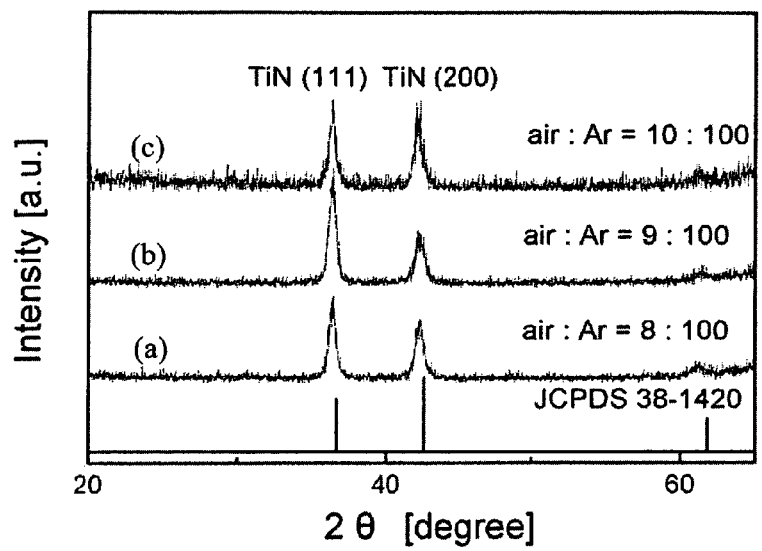
FIG. 2 is an X-ray diffraction pattern of TiN films manufactured in accordance with the method of the present invention.
Figure 3:
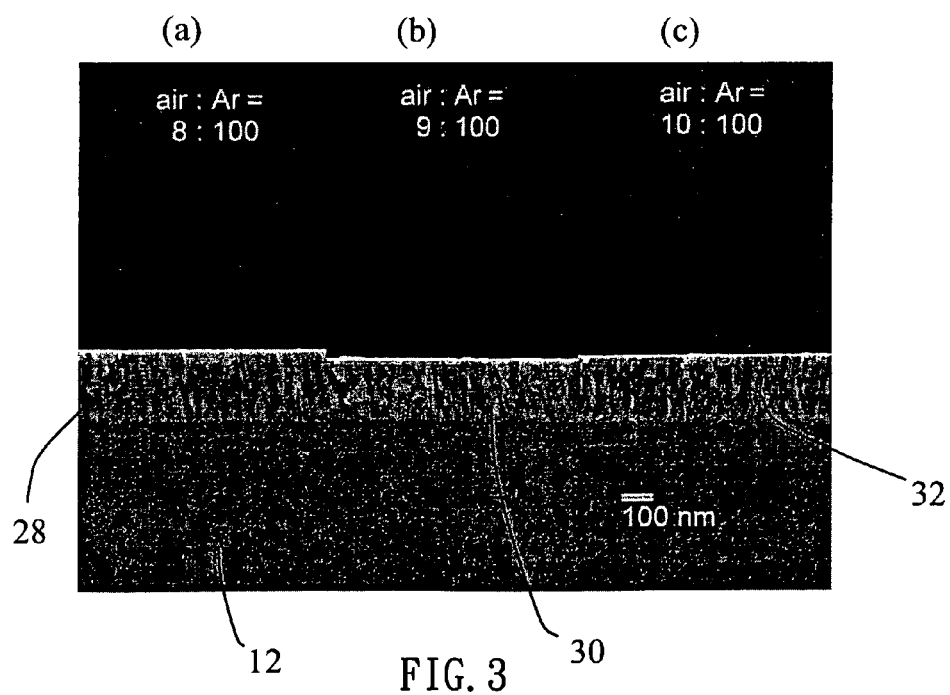
FIG. 3 is a micrograph of a cross-sectional view of the TiN films manufactured in accordance with the method of the present invention.

The thin film 28 formed in accordance with the method of the present invention shows a golden color and has a hardness about 21±1 GPa, and a resistivity, which is measured by four-point probe, about 83±5 $\mu\Omega$-cm. Those characteristics are matched with those of a general TiN compound, which shows a golden color and has a hardness ranging from 18 GPa to 21 GPa, and a resistivity ranging from 18 to 170 $\mu\Omega$-cm. The thin film 28 is further analyzed by an X-ray diffraction instrument, the result of which is shown as the curve (a) in FIG. 2. Compared with the JCPDS card number 38-1420, the structure of the thin film 28 is confirmed to be the same as that of the general TiN compound. Furthermore, a field-emission scanning electron microscope (FE-SEM) is used to observe the cross-section of the thin film 28. The result, as shown in the portion (a) of FIG. 3, indicates that the thin film 28 has a columnar crystal structure. Consequently, all of the aforesaid results confirm that the thin film 28 formed according to the method of the present invention is indeed a TiN film.

Several experiments were conducted under the conditions that the working pressure of the vacuum chamber 14 was maintained at $1\times10^{-3}$ Torr, the output power of the direct current power supply 26 was set at 200 Watts, and the gas mixtures with different flow rate ratios of the air 20 to the argon 22 were respectively introduced into the vacuum chamber 14. The experimental results are shown in the following Table 1. The results show that TiN films can be formed on different substrates by sputtering deposition tinder a certain range of the flow rate ratio of air to argon.

As shown in Table 1, when the gas mixture introduced into the vacuum chamber 14 has the flow rate ratio of air to argon in a range of 7:100 to 11:100, the TiN film can be formed by sputtering deposition. In addition, the curves (b) and (c) shown in FIG. 2 indicate that when the flow rate ratios of air to argon are 9:100 and 10:100 respectively, the TiN film having the preferred orientation of (111) can be formed. Furthermore, as shown in the portions (a) and (b) of FIG. 3, the TiN films 30 and 32 formed under aforesaid conditions respectively show the columnar crystal structure.

Because the method of the present invention is carried out by introducing a gas mixture of air and argon into the vacuum chamber, the vacuum chamber doesn't have to be pumped down to a high vacuum level as the base pressure of $1\times10^{-6}$ Torr of the prior art method. On the contrary, the vacuum chamber of the present invention only has to be pumped down to a base pressure of $5\times10^{-6}$ Torr, which takes about 20 minutes, or to a base pressure of $1\times10^{-4}$ Torr, which takes only about 2 to 3 minutes.

As stated above the time for performing the manufacturing processes of the present invention is greatly reduced compared with the prior art, and the cost for performing of the method of the present invention is also lower than that of the prior art method because the method of the present invention doesn't require dedicated vacuum chamber and vacuum pump. Further, the nitrogen used in the prior art method has to be obtained from the purification of air, while the air used in the present invention can be obtained everywhere, thus the manufacturing process of the present invention is simplified and the cost of the raw gas used is also reduced. In other words, since the method of the present invention can form TiN film rapidly with simple equipment and lower cost, it improves the disadvantages of the prior art method and has a remarkable market potential.

Several experiments for ZrN films were also conducted by using a method same as the above-mentioned method of forming the TiN film, except that the Zirconium target is used. To sputter ZrN films on silicon substrates, the gas mixtures with different flow rate ratios of air to argon were respectively introduced into the vacuum chamber under a base pressure of $1\times10^{-4}$ Torr and the sputtering deposition was performed for 20 minutes under the conditions that the working pressure of the vacuum chamber was maintained at $1\times10^{-3}$ Torr and the output power of the direct current power supply was set at 200 Watts. The experimental results are shown in the following Table 2.

TABLE 2

| Ratio (Air/Argon) | Color | Resistivity ($\mu\Omega$-cm) |
| --- | --- | --- |
| 11/100 | Golden | 115 ± 10 |
| 12/100 | Golden | 123.1 ± 10 |
| 13/100 | Golden | 193.8 ± 10 |

TABLE 1

| Ratio (Air/Argon) | Color | X-ray Diffraction analysis result | Preferred Orientation | Lattice Constant | Resistivity ($\mu\Omega$-cm) | Hardness (GPa) |
| --- | --- | --- | --- | --- | --- | --- |
| 7/100 | Golden | TiN | 111 | 4.249 | 101 ± 2 | 20 ± 1 |
| 8/100 | Golden | TiN | 111 | 4.240 | 83 ± 5 | 21 ± 1 |
| 9/100 | Golden | TiN | 111 | 4.247 | 69 ± 3 | 21 ± 2 |
| 10/100 | Golden | TiN | 111 | 4.252 | 89 ± 2 | 23 ± 1 |
| 11/100 | Golden | TiN | 200 | 4.251 | 124 ± 5 | 18 ± 1 |

Figure 4:
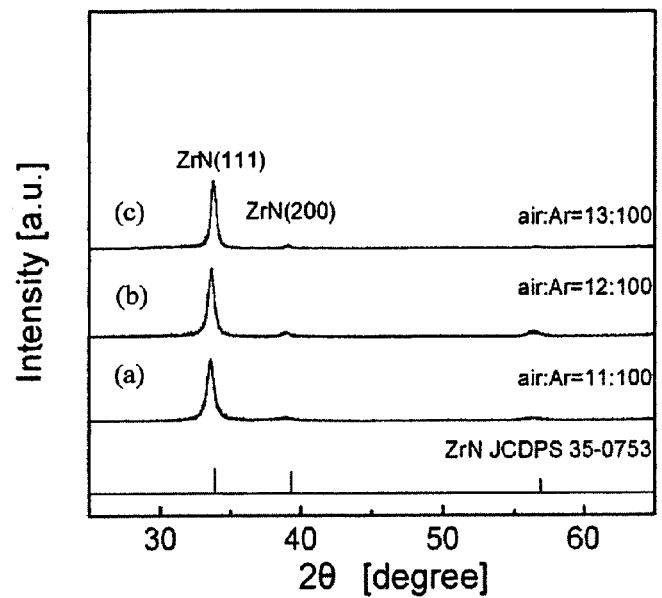
FIG. 4 is an X-ray diffraction pattern of ZrN films manufactured in accordance with the method of the present invention.

FIG. 4 shows an X-ray diffraction pattern of the resulted films. In FIG. 4, curves (a), (b) and (c) represent the films produced under the flow rate ratios of air to argon of 11:100, 12:100 and 13:100 respectively. Compared with the JCPDS card number 35-0753, these resulted films are confirmed to be the ZrN films. In addition, these resulted films have a resistivity within the resistivity range (36.1-260 μΩ-cm) of a general TiN compound.

Figure 5:
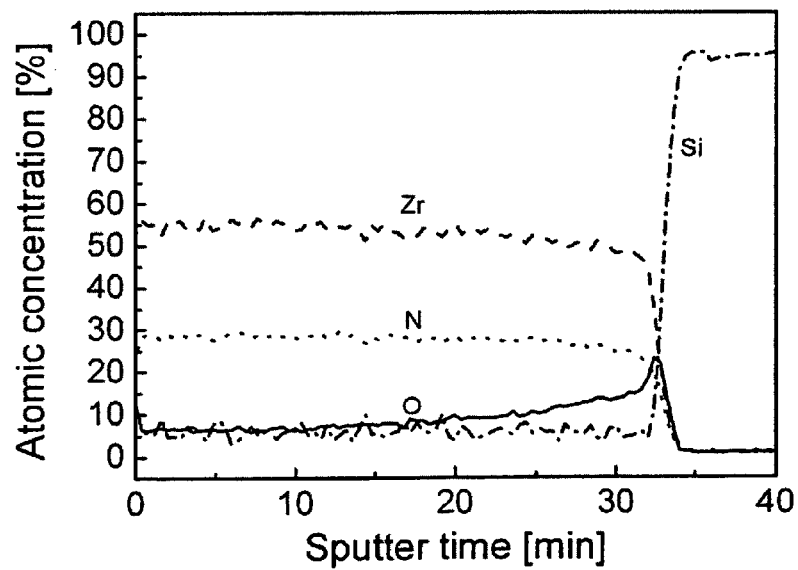
FIG. 5 is an Auger Electron Spectroscopy (ASE) depth profile of a ZrN film manufactured in accordance with the method of the present invention.

FIG. 5 is an ASE (Auger Electron Spectroscopy) depth profile of the resulted ZrN film produced with the flow rate ratio of air to argon of 12:100. In FIG. 5, the X-axis represents the bombardment time that the argon ions bombard the substrate coated with the ZrN film, the values of which correspond to the bombardment depths, and the Y-axis represents the ratio of emitted elements, the values of which are the contents of the elements spatially distributed in the film. FIG. 5 reveals that the resulted film contains zirconium and nitrogen and has a relatively higher oxygen content at the neighborhood of the interface between the resulted film and the substrate, which is a differential of the film produced by the method of the present invention compared to the film produced by the prior art method.

The following Table 3 shows another experimental results for ZrN films, which were produced by the above-mentioned method and conditions, except that the base pressure was set at $1 \times 10^{-5}$ Torr.

TABLE 3

| Ratio (Air/Argon) | Color | X-ray Diffraction analysis result | Resistivity (μΩ-cm) |
| --- | --- | --- | --- |
| 11/100 | Golden | ZrN | 118.7 ± 20 |
| 12/100 | Golden | ZrN | 104.8 ± 10 |
| 13/100 | Golden | ZrN | 110.3 ± 10 |

Table 3 reveals that the characteristics of resulted films made by the method of the present invention match those of a general ZrN compound.

The following Table 4 shows still another experimental results for ZrN films, which were produced by the above-mentioned method and conditions, except that the base pressure was set at $1 \times 10^{-6}$ Torr.

TABLE 4

| Ratio (Air/Argon) | Color | X-ray Diffraction analysis result | Resistivity (μΩ-cm) |
| --- | --- | --- | --- |
| 11/100 | Golden | ZrN | 107 ± 10 |
| 12/100 | Golden | ZrN | 96.9 ± 10 |
| 13/100 | Golden | ZrN | 123.7 ± 20 |
| 14/100 | Golden | ZrN | 134.4 ± 10 |

Table 4 reveals that the characteristics of resulted films made by the method of the present invention match those of a general ZrN compound.

According to the study of the present invention, although various parameter variations of the sputtering deposition are adopted by the method of the present invention, the TiN film or the ZrN film can be also formed rapidly. In fact, the experimental data indicates that a golden TiN or ZrN film can be formed within 60 to 7200 seconds under the conditions of maintaining the base pressure of the vacuum chamber at a range of $5 \times 10^{-6}$ Torr to $5 \times 10^{-2}$ Torr, the working pressure at a range of $5 \times 10^{-4}$ Torr to $5 \times 10^{-2}$ Torr (preferably at a range of $8 \times 10^{-4}$ Torr to $2 \times 10^{-2}$ Torr), the flow rate ratio of air to argon in a range of 5:100 to 15:100, the electrical field provided by either a direct current power supply or an alternating current (radio frequency) power supply with a power at a range of 100 Watts to 5000 Watts, and the reaction temperature at a range of 20° C. to 300° C. with a biased voltage applied to the substrate at a range of −1 V to −200 V, and preferably at a range of −20 to −50 V, or without any biased voltage.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming a metallic nitride film, comprising the steps of:
  (a) providing a titanium or zirconium target and a substrate in a vacuum chamber; and
  (b) forming a metallic nitride film, consisting essentially of TiN or ZrN, on a surface of said substrate by sputtering deposition under the conditions of
    i. maintaining a working pressure of said vacuum chamber in a range of $5 \times 10^{-4}$ Torr to $5 \times 10^{-2}$ Torr and
    ii. introducing a gas mixture of air, which acts as a reactive gas, and argon into said vacuum chamber at a flow rate ratio of the air to the argon ranging from 5:100 to 15:100;
  wherein a direct current power ranging from 100 Watts to 5000 Watts is applied by a power supply in step (b);
  wherein a biased voltage ranging from 0 to −200 V is applied to said substrate in step (b).

2. The method as claimed in claim 1, wherein the working pressure of said vacuum chamber ranges from $8 \times 10^{-4}$ Torr to $2 \times 10^{-2}$ Torr in step (b).

3. The method as claimed in claim 1, wherein the working pressure of said vacuum chamber is substantially equal to $1 \times 10^{-3}$ Torr in step (b).

4. The method as claimed in claim 1, wherein the flow rate ratio of the air to the argon ranges from 7:100 to 14:100 in step (b).

5. The method as claimed in claim 1, wherein a direct current power of 200 Watts is applied by a power supply in step (b).

6. The method as claimed in claim 1, wherein an alternating current is applied by a power supply in step (b).

7. The method as claimed in claim 1, wherein a biased voltage ranging from −20 to −50 V is applied to said substrate in step (b).

8. The method as claimed in claim 1, wherein the step (b) is carried out at a temperature ranging from 20 to 300° C.

9. The method as claimed in claim 1, wherein the step (b) is carried out at a room temperature.

10. The method as claimed in claim 1, wherein the step (b) is performed at least 60 seconds.

11. The method as claimed in claim 1, wherein said vacuum chamber has a base pressure ranging from $5 \times 10^{-6}$ Torr to $5 \times 10^{-2}$ Torr in step (b).

12. The method as claimed in claim 1, wherein said substrate is not applied with any biased voltage in step (b).

* * * * *